United States Patent
Pohjonen

(10) Patent No.: US 10,228,474 B2
(45) Date of Patent: Mar. 12, 2019

(54) FLEXIBLE PIXEL ARRAY CONTROLLED BY CONDUCTIVE SHAPE MEMORY MATERIAL

(71) Applicant: Nokia Technologies Oy, Espoo (FI)

(72) Inventor: Helena Pohjonen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/747,875

(22) PCT Filed: Jul. 22, 2016

(86) PCT No.: PCT/FI2016/050539
§ 371 (c)(1),
(2) Date: Jan. 26, 2018

(87) PCT Pub. No.: WO2017/029431
PCT Pub. Date: Feb. 23, 2017

(65) Prior Publication Data
US 2018/0224566 A1    Aug. 9, 2018

(30) Foreign Application Priority Data

Aug. 17, 2015 (EP) ..................... 15181293

(51) Int. Cl.
| | | |
|---|---|---|
| G01T 1/24 | (2006.01) | |
| G01T 7/00 | (2006.01) | |
| H01L 27/146 | (2006.01) | |

(52) U.S. Cl.
CPC ................ G01T 7/00 (2013.01); G01T 1/244 (2013.01); *H01L 27/14663* (2013.01)

(58) Field of Classification Search
CPC ...... G01T 1/244; G01T 7/00; H01L 27/14663
See application file for complete search history.

(56) References Cited

U.S. PATENT DOCUMENTS

| | | | |
|---|---|---|---|
| 2013/0043400 A1 | 2/2013 | Nakatsugawa et al. | ...... 250/366 |
| 2013/0134316 A1 | 5/2013 | Nakatsugawa et al. | ...... 250/366 |
| 2013/0334427 A1 | 12/2013 | Kaneko et al. | .......... 250/363.01 |

*Primary Examiner* — Mark R Gaworecki
(74) *Attorney, Agent, or Firm* — Harrington & Smith

(57) ABSTRACT

An apparatus, method and a computer program are provided. The apparatus includes: an array of pixels, configured to detect radiation, provided on a flexible substrate; a conductive shape memory material coupled to the flexible substrate; and drive circuitry configured to apply a current to the conductive shape memory material in order to change a shape of the conductive shape memory material and the flexible substrate.

19 Claims, 8 Drawing Sheets

FLEXIBLE PIXEL ARRAY CONTROLLED BY CONDUCTIVE SHAPE MEMORY MATERIAL

TECHNOLOGICAL FIELD

Embodiments of the present invention relate to radiography. In particular, they relate to the detection of X-ray radiation using a bendable apparatus.

BACKGROUND

Radiography has medical and industrial applications. Radiography is used, for example, to examine bones, teeth and organs in a medical context. Radiography is also used as a method of non-destructive testing, for instance, in the automotive industry, the aeronautical industry and the nuclear energy industry.

BRIEF SUMMARY

According to various, but not necessarily all, embodiments of the invention there is provided an apparatus, comprising: an array of pixels, configured to detect radiation, provided on a flexible substrate; a conductive shape memory material coupled to the flexible substrate; and drive circuitry configured to apply a current to the conductive shape memory material in order to change a shape of the conductive shape memory material and the flexible substrate.

According to various, but not necessarily all, embodiments of the invention there is provided a method, comprising: causing a current to be applied to a conductive shape memory material, coupled to a flexible substrate having an array of pixels thereon that are configured to detect radiation, which causes the conductive shape memory material and the flexible substrate to change shape.

According to various, but not necessarily all, embodiments of the invention there is provided computer program instructions that, when performed by at least one processor, cause the above method to be performed.

According to various, but not necessarily all, embodiments of the invention there is provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

Embodiments of the present invention relate detecting radiation using a shape-changing detection apparatus. The apparatus comprises a conductive shape memory material coupled to a flexible substrate. An array of pixels, configured to detect radiation, is provided on the flexible substrate.

The application of a current to the conductive shape memory material by drive circuitry of the apparatus causes a shape of the conductive shape memory material and the flexible substrate to change. The conductive shape memory material may, for example, bend in response to the application of the current, and the coupling between conductive shape memory material and the flexible substrate causes the flexible substrate to bend.

The change in shape of the flexible substrate enables the array of pixels to be positioned closer to an object being imaged, potentially improving image quality and reducing the time required to image non-planar objects. The quantity/dose of radiation that is required for imaging may also be lower.

Figure 1:
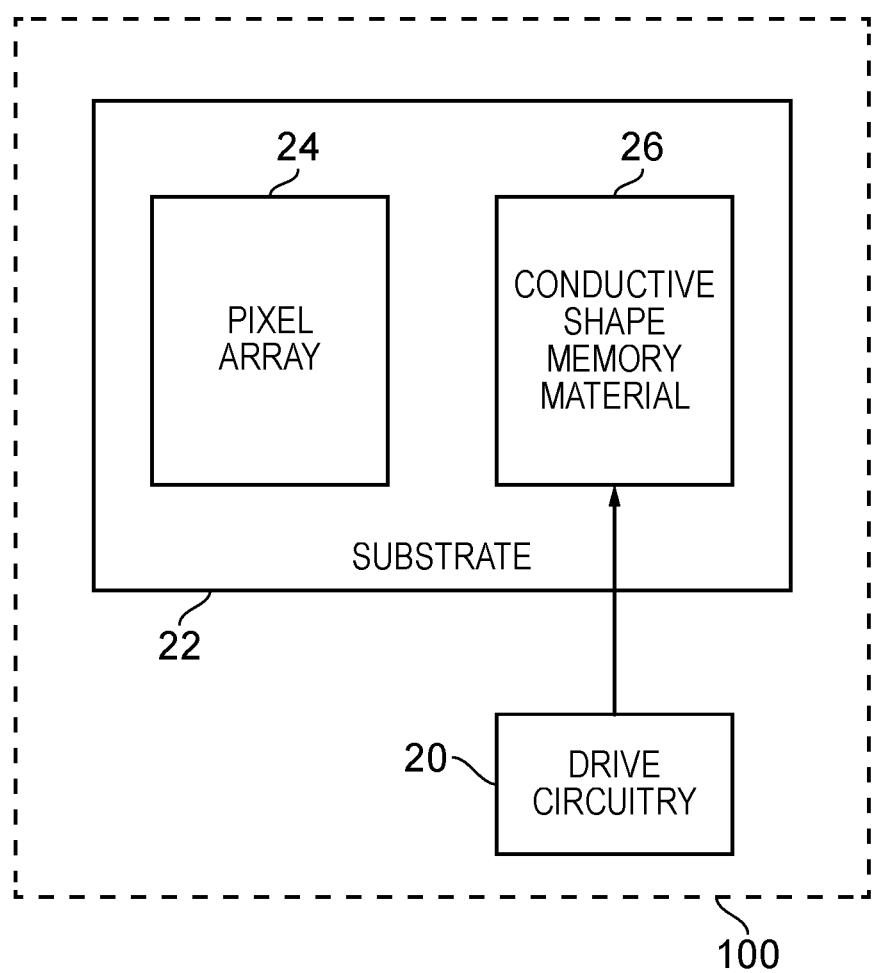
FIG. 1 illustrates a first schematic of an apparatus.

FIG. 1 illustrates a first schematic of an apparatus 100. The apparatus 100 illustrated in FIG. 1 comprises drive circuitry 20, a substrate 22, a pixel array 24 and a conductive shape memory material 26.

The array of pixels 24 could be a one, two or three dimensional array. If the array 24 is two dimensional, it may be arranged in perpendicular column and rows. The pixels in the array 24 are configured to detect radiation, such as electromagnetic (wave) radiation or particle radiation. The pixels may be formed of semiconductor material configured to detect radiation, or one or more other materials configured to detect radiation.

In some embodiments, the pixels in the array 24 are configured to detect electromagnetic radiation in the form of X-ray radiation. Detection may occur directly or indirectly. In direct detection, X-rays are converted directly into an electric current by the pixels. Such pixels may, for example, be made from alpha selenium or any other appropriate material.

In indirect detection, X-rays are converted into photons which are then, in turn, converted into electric current by the pixels. The X-rays are converted into photons by one or more scintillators. The one or more scintillators may be part of the array of pixels 24, or be separate from the array of pixels 24. In indirect detection, the pixels in the array 24 may include any type of photodetector for detecting photons that have been derived from X-rays, including diodes and field-effect transistors.

The array of pixels 24 is provided on a flexible substrate 22. The flexible substrate 22 may be substantially planar in shape, having a length and width that are each much greater than its thickness/depth. The flexibility of the substrate 22 may be the same as, or greater than, the flexibility of the array of pixels 24. The substrate 22 could be made from a fabric or a plastic, for instance, such as polyimide (for example, Kapton®), polyethylene naphthalate (PEN) or polyethylene terephthalate (PET).

The conductive shape memory material 26 is coupled to the flexible substrate 22. The conductive shape memory material 26 is an electrically conductive material that may, for example, be deformable by hand at room temperature.

The conductive shape memory material 26 has a parent/original shape. The conductive shape memory material 26 "remembers" its parent shape, such that when the conductive shape memory material 26 is heated beyond its transition temperature, the shape of the conductive shape memory material 26 changes from its current shape to its parent shape automatically (that is, without any mechanical assistance). The change in shape that occurs is visible to the naked eye.

The conductive shape memory material 26 may be a one-way shape memory material or a two-way shape memory material.

When a one-way shape memory material is heated to a temperature above its transition temperature, it changes shape from its current shape to its parent shape. When the material subsequently cools to a temperature below its transition temperature, the material remains in its parent shape (unless mechanically deformed, for example).

A two-way shape memory material remembers two different shapes. It has a high-temperature parent shape, and also a low-temperature parent shape. When a two-way shape memory material is heated to a temperature above a first transition temperature, it changes shape from its current shape to its high-temperature parent shape automatically (that is, without any mechanical assistance). When the material subsequently cools to a temperature below a second transition temperature, the material reverts to its low-temperature parent shape automatically (that is, without any mechanical assistance). The first and second transition temperatures may or may not be the same.

The conductive shape memory material 26 could, for example, be a conductive shape memory alloy (such as nickel-titanium, copper-aluminum-nickel or copper-zinc-aluminum) or a conductive shape memory polymer.

The drive circuitry 20 is configured to apply an electric current to the conductive shape memory material 26. The application of the electric current to the conductive shape memory material 26 causes resistive heating. The amount of electric current that is applied by the drive circuitry 20 is sufficient to cause the conductive shape memory material 26 to heat to a temperature above its transition temperature, causing the shape of the conductive shape memory material 26 to change from its current shape to its parent shape.

Due to the coupling between the conductive shape memory material 26 and the substrate 22, the change in shape of the conductive shape memory material 26 causes the shape of the substrate 22 to change. The change in shape of the substrate 22 causes the positioning of at least some of the pixels in the array 24, relative to each other, to change.

The parent shape of the conductive shape memory material 26 may, for example, be a bent/curved shape. If so, when the conductive shape memory material 26 is heated to a temperature above its transition temperature, the conductive shape memory material 26 bends, causing the substrate 22 to bend.

Figure 2:
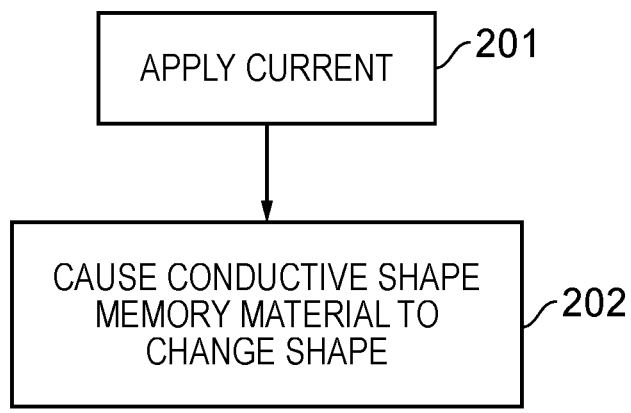
FIG. 2 illustrates a flow chart of a first method.

FIG. 2 illustrates a flow chart of a first method. In block 201 of FIG. 2, the drive circuitry 20 applies a current to the conductive shape memory material 26, which changes shape in block 202 in the manner described above.

Figure 3:
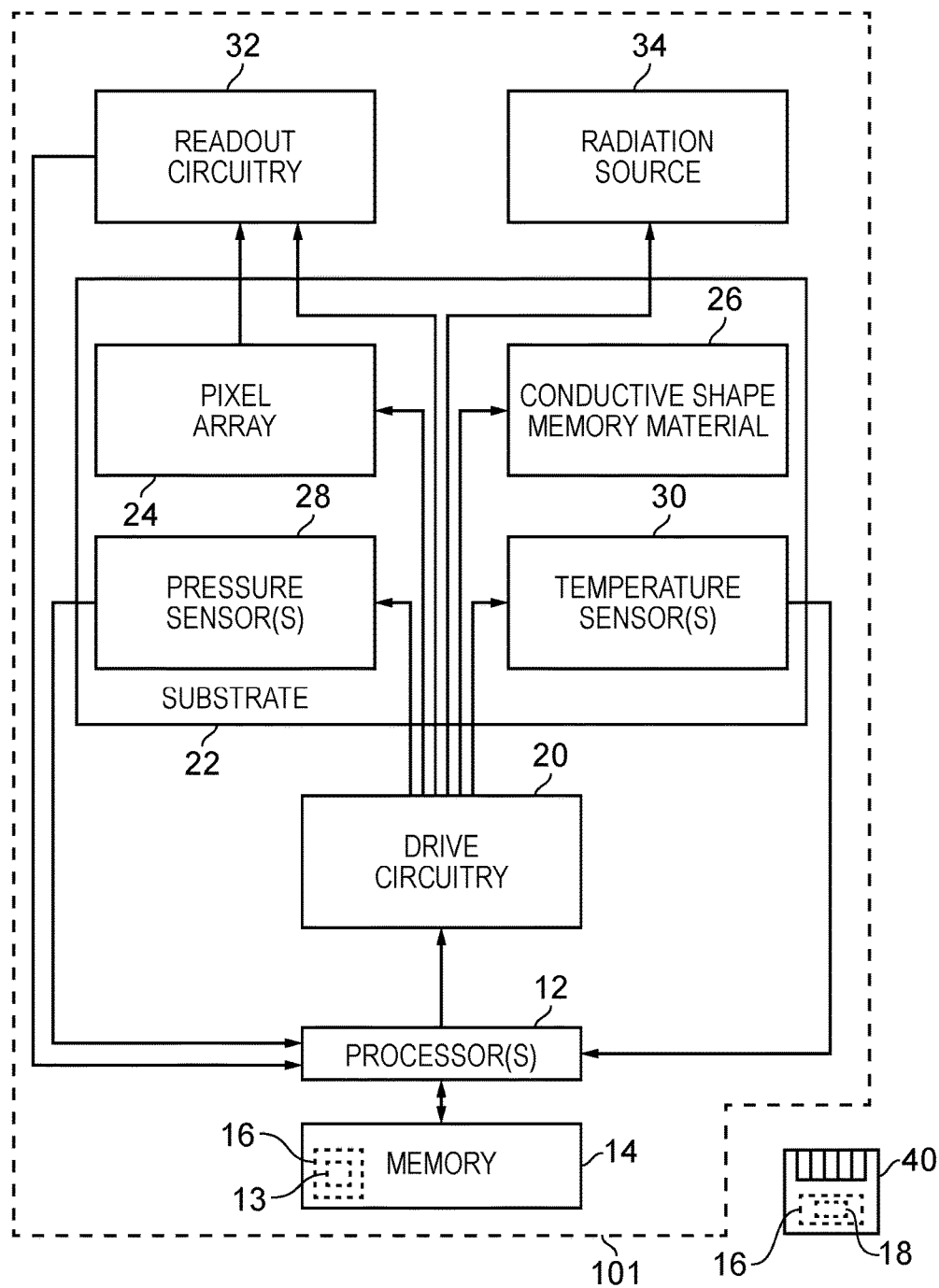
FIG. 3 illustrates a second schematic of the apparatus.

FIG. 3 illustrates a second schematic of the apparatus, which includes some additional elements relative to FIG. 1 and is given the reference numeral 101. The elements having the same reference numerals in FIG. 3 as in FIG. 1 are the same as those described above in relation to FIG. 1.

The apparatus 101 illustrated in FIG. 3 comprises the drive circuitry 20, the substrate 22, the array of pixels 24 and the conductive shape memory material 26 illustrated in FIG. 1 and further comprises at least one processor 12, memory 14, one or more pressure sensors 28, one or more temperature sensors 30, readout circuitry 32 and at least one radiation source 34.

The elements 20, 22, 24, 26, 28, 30, 32 and 34 are operationally coupled and any number or combination of intervening elements can exist (including no intervening elements).

The drive circuitry 20 is under the control of the processor 12 and is configured to apply electric current to the conductive shape memory material 26, the pressure sensors 28, the temperature sensors 30, the readout circuitry 32 and the radiation source 34. The current which is provided to the pressure sensors 28, the temperature sensors 30, the readout circuitry 32 and the radiation source 34 is provided to power those elements. The applied current may be different for each element 28, 30, 32, 34, and different from the current applied to the conductive shape memory material 26.

The pressure sensors 28 are configured to provide inputs to the processor 12. The pressure sensors 28 are provided on the substrate 22 in this example. They may, for instance, be positioned on the same face of the substrate as the array of pixels 24.

The pressure sensors 28 are configured to sense pressure applied by the apparatus 101 to an object when the conductive shape memory material 26 changes shape/bends, and provide inputs to the processor 12 that are indicative of the sensed pressure. The object may, for example, be an object that is being imaged or is to be imaged by the array of pixels 24.

The temperature sensors 30 are configured to provide inputs to the processor 12. The temperature sensors 30 are provided on the substrate 22 in this example. They may, for instance, be positioned adjacent to one or more portions of the conductive shape memory material 26. The temperature sensors 30 are configured to sense the temperature of the conductive shape memory material 26, and provide inputs to the processor 12 that are indicative of the sensed temperature.

The radiation source 34 is configured to generate and transmit radiation, some of which may pass through an object before being detected by the array of pixels 24. The radiation may be electromagnetic radiation, such as X-ray radiation, or particle radiation.

The readout circuitry 32 is configured to read information from each pixel in the array of pixels 24 and to provide that information to the processor 12. The processor 12 is configured to form a one, two or three dimensional image from the information provided by the readout circuitry 32.

The processor 12 is configured to read from and write to the memory 14. The processor 12 may also comprise an output interface via which data and/or commands are output by the processor 12 and an input interface via which data and/or commands are input to the processor 12.

The memory 14 stores a computer program 16 comprising computer program instructions (computer program code) 18 that controls the operation of the apparatus 101 when loaded into the processor 12. The computer program instructions 18, of the computer program 16, provide the logic and routines that enables the apparatus to perform the method illustrated in FIG. 5. The processor 12 by reading the memory 14 is able to load and execute the computer program 16.

As illustrated in FIG. 3, the computer program 16 may arrive at the apparatus 101 via any suitable delivery mechanism 40. The delivery mechanism 40 may be, for example, a non-transitory computer-readable storage medium, a computer program product, a memory device, a record medium such as a compact disc read-only memory (CD-ROM) or digital versatile disc (DVD). The delivery mechanism 40 may be a signal configured to reliably transfer the computer program 16. The apparatus 101 may propagate or transmit the computer program 16 as a computer data signal.

Although the memory 14 is illustrated as a single component/circuitry it may be implemented as one or more separate components/circuitry some or all of which may be integrated/removable and/or may provide permanent/semi-permanent/dynamic/cached storage.

Although the processor 12 is illustrated as a single component/circuitry it may be implemented as one or more separate components/circuitry some or all of which may be integrated/removable. The processor 12 may be a single core or multi-core processor.

Figure 4A:
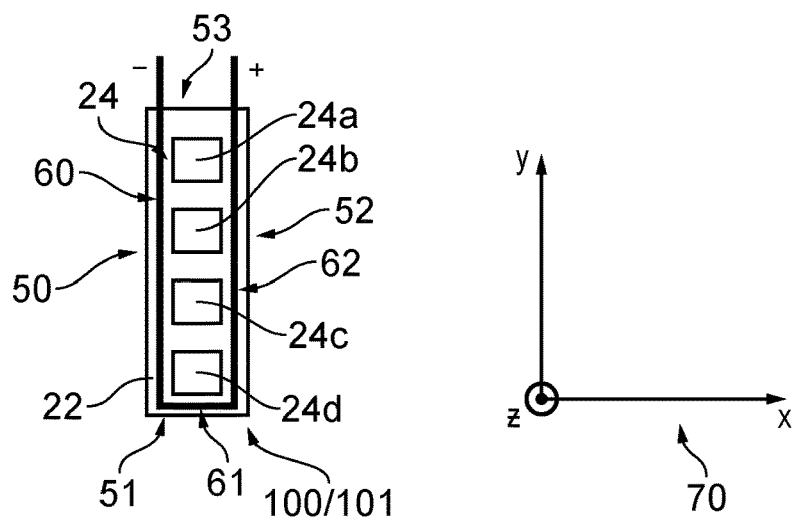
FIG. 4A illustrates a front elevation of a first example of the apparatus, including a conductive shape memory material coupled to a substrate with a one-dimensional array of radiation detecting pixels thereon.

FIG. 4A illustrates a front elevation of a first example of the apparatus 100/101. Cartesian co-ordinate axes 70 are also illustrated in FIG. 4A and other figures, in order to enable the reader to easily orientate one figure with respect to another. In FIG. 4A, orthogonal x, y and z axes are illustrated. Each axis extends in and defines a different, orthogonal dimension. The z-axis extends out of the page in FIG. 4A.

The substrate 22 illustrated in FIG. 4A has a length aligned with the y-axis, a width aligned with the x-axis and a thickness/depth aligned with the z-axis. The substrate is substantially planar in that its length and width are substantially greater than its thickness. In the illustrated example, the length of the substrate 22 is greater than the width, but this need not necessarily be the case. The length and the width of the substrate 22 could be substantially the same.

A first edge 50 of the substrate 22 is aligned with the length (y) dimension of the substrate 22. A second edge 51 of the substrate 22 is aligned with the width (x) dimension of the substrate 22. A third edge 52 of the substrate 22 is aligned with the length (y) dimension of the substrate 22 and is separated from the first edge 50 by the width of the substrate 22. A fourth edge 53 of the substrate 22 is aligned with the width dimension (x) of the substrate 22 and is separated from the second edge 51 by the length of the substrate 22.

In the example illustrated in FIG. 4A, the array of pixels 24 is one-dimensional and includes four pixels labelled with the reference numerals 24a-24d. More or fewer pixels may be present in other examples.

The apparatus 100/101 illustrated in FIG. 4A has first, second and third elongate portions 60, 61, 62 of conductive material. The conductive shape memory material 26 provides some or all of the elongate portions 60, 61, 62 of conductive material. For example, in some implementations, each of the first, second and third elongate portions 60, 61, 62 is made from the conductive shape memory material 26. In other implementations, the first and third elongate portions 60, 62 are made from the conductive shape memory material 26, but the second elongate portion 61 is made from a different conductive material (for instance, a metal or a conductive polymer), which is not a shape memory material. In such implementations, the second elongate portion 61 maintains its shape when a current is applied to it which is of a magnitude that would cause the shape of the first and third elongate portions 60, 62 to change.

The first elongate portion 60 of conductive material extends in the length (y) dimension of the substrate 22 and is positioned between the first edge 50 of the substrate 22 and the array of pixels 24 (in the x dimension, at least). The second elongate portion 61 of conductive material extends in the width (x) dimension of the substrate 22 and is positioned between the second edge 51 of the substrate 22 and the array of pixels 24 (in the y dimension, at least). The third elongate portion 62 of conductive material extends in the length (y) dimension of the substrate 22 and is positioned between the third edge 52 of the substrate 22 and the array of pixels 24 (in the x dimension, at least).

In the example illustrated in FIG. 4A, the first, second and third elongate portions 60, 61, 62 are positioned on the same face of the substrate 22 as the array of pixels 24.

When current is applied by the drive circuitry 20, electrons travel along the first elongate portion 60 of conductive material to the second elongate portion 61 of conductive material, and then subsequently to the third elongate portion 62 of conductive material. Electric current flows in the opposite direction.

Figure 4B:
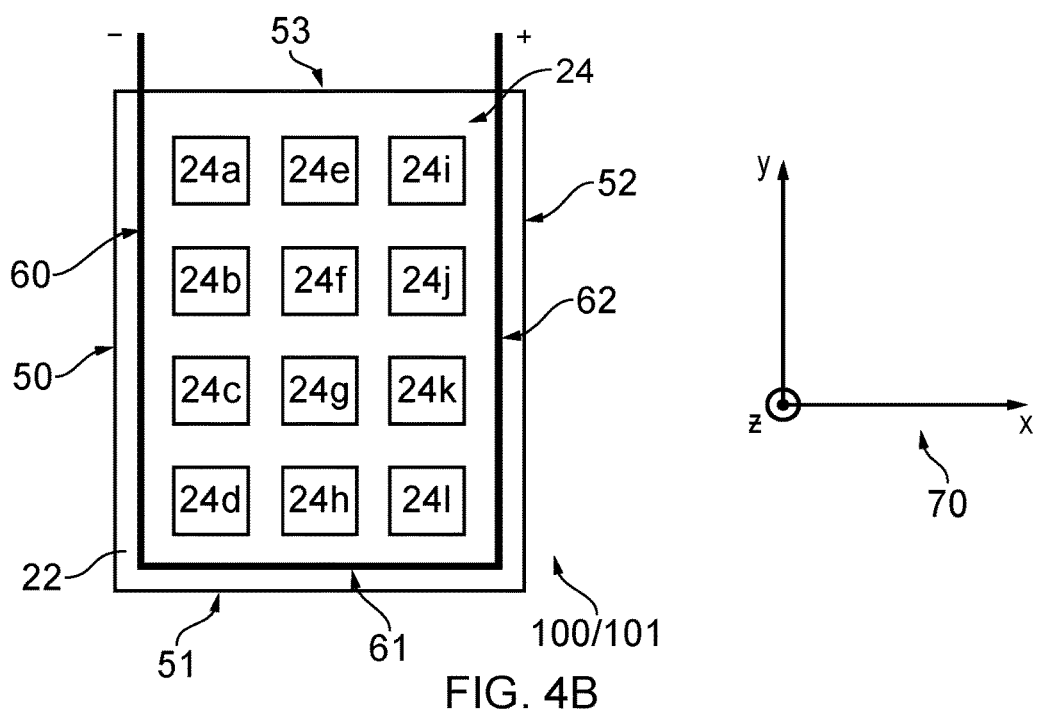
FIG. 4B illustrates a front elevation of a second example of the apparatus, including a conductive shape memory material coupled to a substrate with a two-dimensional array of radiation detecting pixels thereon.

FIG. 4B illustrates a front elevation of a second example of the apparatus 100/101. The second example illustrated in FIG. 4B is similar to the first example illustrated in FIG. 4A, but differs in that the array of pixels 24 is a two-dimensional array rather than a one-dimensional array. The array 24 illustrated in FIG. 4B includes nine pixels labelled with the reference numerals 24a-24l. More or fewer pixels may be present in other examples.

Both FIG. 4A and FIG. 4B illustrate the apparatus 100/101 prior to any current being applied to the conductive shape memory material 26 and the consequent shape change that ensues.

Figure 4C:
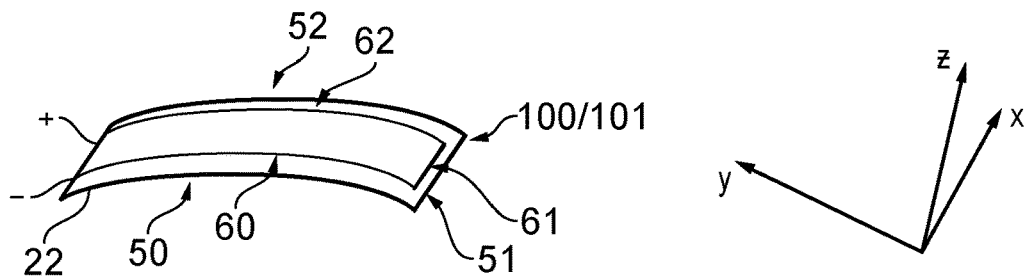
FIG. 4C illustrates a perspective view of either the first or the second example of the apparatus while the apparatus is in a bent state.

FIG. 4C relates to an implementation where the first and third elongate portions 60, 62 are made from conductive shape memory material 26, but the second elongate portion 61 is made from a different conductive material that is not a shape memory material. In the illustrated situation the parent shape of each of the first and third elongate portions 60 is a curved shape and the drive circuitry 20 has applied a current to the conductive shape memory material 26, causing the first and third elongate portions 60, 62 of conductive shape memory material 26 to reach the transition temperature and bend into their parent shapes.

Electric current is also applied to the second elongate portion 61 (since it electrically connects the first and second elongate portions 60, 62), but the second elongate portion 61 maintains its shape in response to the application of the current because it is not a shape memory material.

FIG. 4C illustrates the first and third elongate portions 60, 62 changing shape in the y and z dimensions but not in the x-dimension, which causes the substrate 22 to change shape in the y and z dimensions but not in the x dimension. In the illustrated example, the extent of the substrate 22 decreases in the y dimension, increases in the z dimension and remains the same in the x dimension when the first and third elongate portions 60, 62 change shape/bend.

If the conductive shape memory material 26 is a two-way shape memory material, when the drive circuitry 20 ceases to apply the current to the first and third elongate portions 60, 62, the first and third elongate portions 60, 62 will automatically return to the shapes that they had prior to the application of the current.

Figure 5:
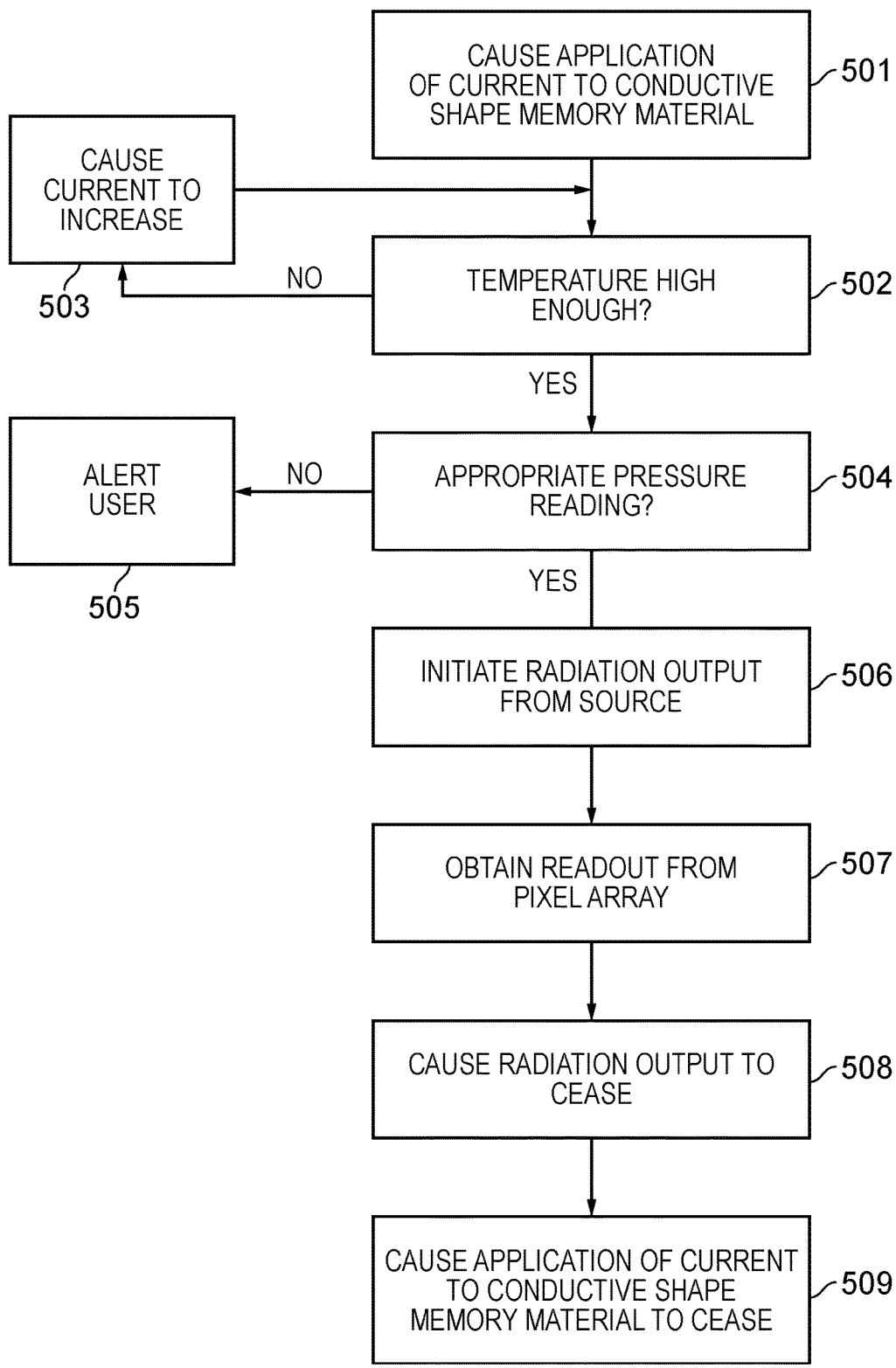
FIG. 5 illustrates a flow chart of a second method.

FIG. 5 illustrates a flow chart of a second method which is carried out by the processor 12 under the control of the computer program code/instructions 18. In block 501 in FIG. 5, the processor 12 causes the drive circuitry 20 to apply a current to the conductive shape memory material 26 of the apparatus 100/101. The drive circuitry 20 applies current to the first, second and third elongate portions 60-62, some or all of which are made from conductive shape memory material 26.

At block 502 in FIG. 5, the processor 12 obtains inputs from the temperature sensors 30 to determine whether the temperature of the conductive shape memory material 26 is high enough to cause the conductive shape memory material 26 to revert to its parent shape. If the temperature is not high enough, the method moves to block 503 and the processor 12 controls the drive circuitry 20 to increase the applied current. The processor 12 may continuously monitor the temperature via inputs from the temperature sensors 30 until it determines that the conductive shape memory material 26 has reached its transition temperature.

In some embodiments, the processor 12 may learn how the conductive shape memory material 26 responds to applied current in order to enable the processor 12 to cause the conductive shape memory material 26 to change shape more quickly on subsequent occasions.

For instance, in this regard, the processor 12 may store information in the memory 14 such as the magnitude of the current that was applied to the conductive shape memory material 26 when it reached the transition temperature. Additionally or alternatively, the processor 12 may store information in the memory 14 regarding the relationship between the increase in applied current over time and associated increase in the temperature of the conductive shape memory material 26 over time. This information may then be used by the processor 12 to control the drive circuitry 20 in a manner that causes the conductive shape memory material 26 to reach its transition temperature more quickly in future.

At block 504, the processor 12 obtains and interprets inputs from the pressure sensors 28. The change in shape of the conductive shape memory material 26 may cause the apparatus 100/101 to apply a force to an adjacent object (for example, an object that is being imaged by the array of pixels 24). If the inputs from the pressure sensors 28 indicate that the pressure being applied by the apparatus 100/101 is above a threshold, the processor 12 may cause an alert to be provided to a user at block 505. Additionally or alternatively, the processor 12 may cause the drive circuitry 20 to cease applying current to the conductive shape memory material 26.

If the inputs from the pressure detectors 20 are below a particular threshold (which could be zero or non-zero), the array of pixels 24 might not be positioned close enough to the object for optimum imaging to occur. In such an instance, the processor 12 may cause an alert to be provided to a user at block 505.

In some embodiments, the processor 12 may not begin to obtain and interpret inputs from the pressure sensors 20 until the transition temperature has been reached, because if the transition temperature has not yet been reached the apparatus 100/101 is not yet exerting pressure on an adjacent object (since a change in shape/bending of the substrate 22 and the conductive shape memory material 26 has not yet occurred).

In some circumstances, it might not be necessary for the processor 12 to obtain and interpret inputs from the pressure sensors 20. For example, if an object (or objects) of a given shape are to be imaged on multiple occasions by the apparatus 100/101, once the processor 12 has determined that application of a current of a particular magnitude to the conductive shape memory material 26 does not cause the pressure sensors 28 to indicate that the pressure being applied by the apparatus 100/101 is above a threshold, it may not be necessary for the processor 12 to go through the process of obtaining and interpreting inputs from the pressure sensors 20 on subsequent occasions when that/those object(s) is/are being imaged.

At block 506 in FIG. 5, the processor 12 controls the radiation source 34 to initiate radiation output. Radiation is output in the direction of the array of pixels 24.

At block 507 in FIG. 5, the processor 12 controls the readout circuitry 32 to read the pixels in the array 24 (while the conductive shape memory material 26 is in its parent shape) and provide the readout information to the processor 12. The processor 12 may then construct an image based on the readout information and, in some embodiments, control a display to display the image.

At block 508 in FIG. 5, the processor 12 controls the radiation source 34 to cease outputting radiation and, at block 509 in FIG. 5, the processor 12 causes the application of current to the conductive shape memory material 26 to cease.

Figure 6A:
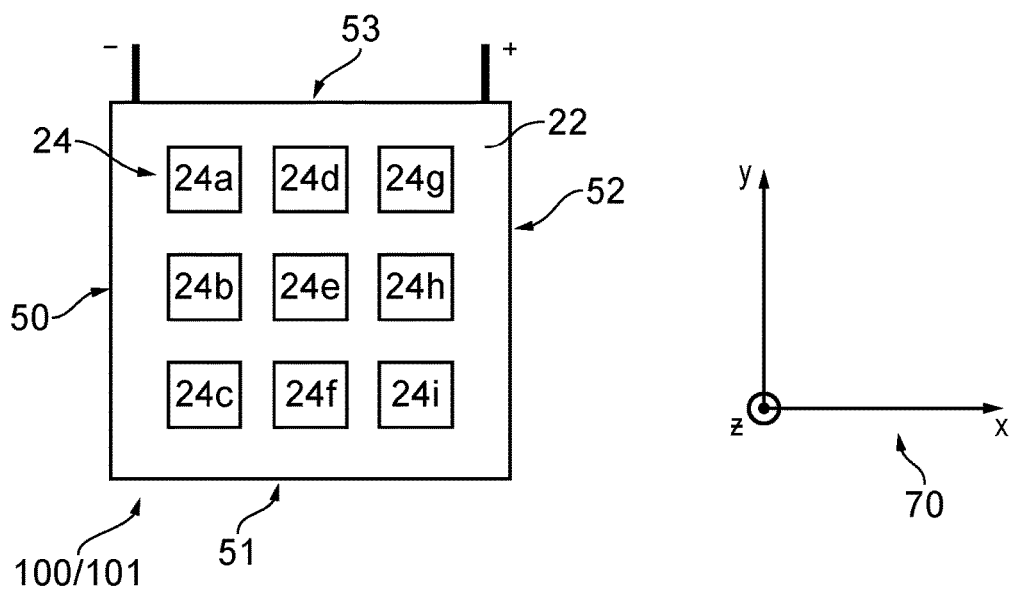
FIGS. 6A & 6B illustrates a front and rear elevations of a third example of the apparatus in which the conductive shape memory material is positioned on a different face of the substrate from the array of radiation detecting pixels.
Figure 6B:
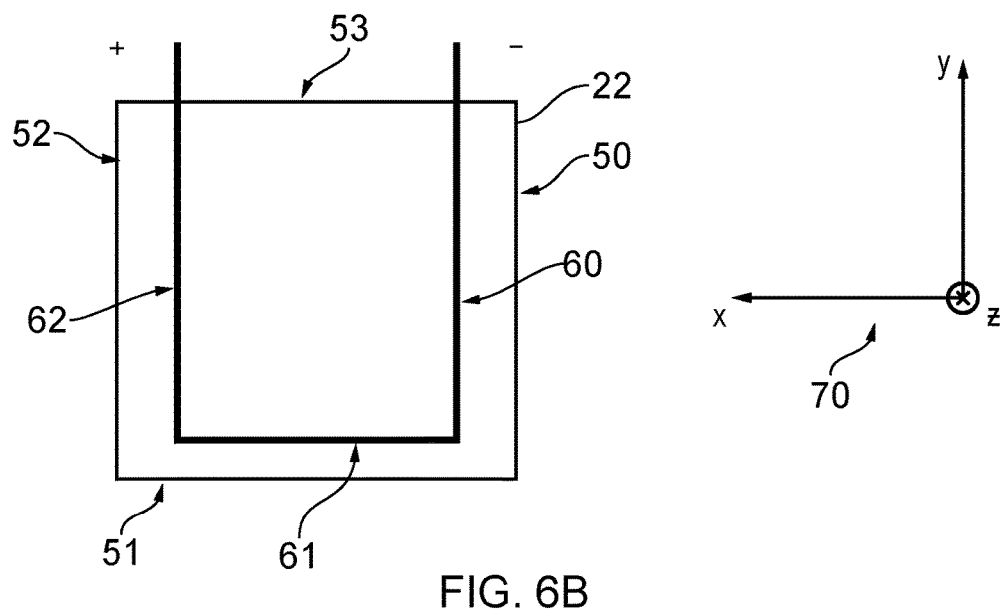

FIG. 6A illustrates a front elevation of a third example of the apparatus 100/101. FIG. 6B illustrates a rear elevation of a third example of the apparatus 100/101. The third example of the apparatus 100/101 is similar to the second example illustrated in FIG. 4B, but differs in that the first, second and third elongate portions 60-62 are not located 60, 61, 62 on the same face of the substrate 22 as the array of pixels 24.

In the third example illustrated in FIGS. 6A and 6B, the array of pixels 24 is located on a first face of the substrate 22 defined by the length (y) and width (x) dimensions of the substrate 22, and the first, second and third elongate portions 60-62 of conductive material are located on a second face of the substrate 22 defined by the length (y) and width (x) dimensions of the substrate 22. The first and second faces are separated in the depth (z) dimension by the thickness of the substrate 22.

In the first and second examples of the apparatus 100/101 illustrated in FIGS. 4A and 4B, the first and third elongate portions 60, 62 of conductive material are separated from the array of pixels 24 in the width (x) dimension. The second elongate portion 61 of conductive material is separated from the array of pixels 24 in the length (y) dimension. This prevents the first, second and third elongate portions 60-62 of conductive material from being imaged by the array of pixels 24.

In the third example, however, since the first, second and third elongate portions 60-62 of conductive material are positioned behind the array of pixels 24, there is no risk of them being imaged and, therefore, such separation is not required.

Figure 7:
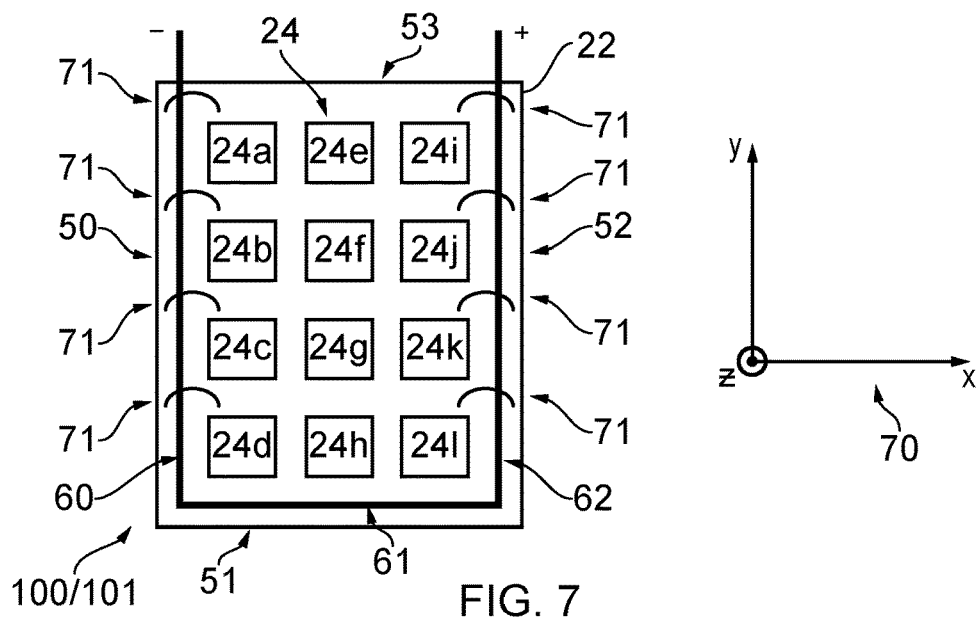
FIG. 7 illustrates a front elevation of a fourth example of the apparatus in which the conductive shape memory material is coupled to the substrate by a plurality of grips.

FIG. 7 illustrates a front elevation of a fourth example of the apparatus 100/101 in which the first, second and third elongate portions 60-62 of conductive material are coupled to the substrate 22 by a plurality of grips 71.

The grips 71 may, for example, be U-shaped grips which bind the first, second and third elongate portions 60-62 to a face of the substrate 22, which may or may not be the same face as that on which the array of pixels 24 is provided.

The grips 71 bind/couple the first and third elongate portions 60, 62 of conductive material to the substrate 22 at various binding positions along the length (y) dimension.

Each binding position is separated in the length (y) dimension from one or two adjacent binding positions. The first and third elongate portions 60, 62 of conductive material are uncoupled/unbound to the substrate 22 between the binding positions, providing them with freedom to change shape.

It can be seen in FIG. 7 that there are a series of regions between adjacent binding positions that is aligned with pixels in the width (x) dimension. For example, the pixels labeled with the reference numerals 24a, 24e and 24i in FIG. 7 are aligned with a region between two binding positions at which the first elongate portion 60 of conductive material is bound to the substrate 22, and aligned with a region between two binding positions at which the third elongate portion 62 of conductive material is bound to the substrate 22.

Other aspects of the fourth example of the apparatus 100/101 may be the same as in the other examples described above.

Figure 8A:
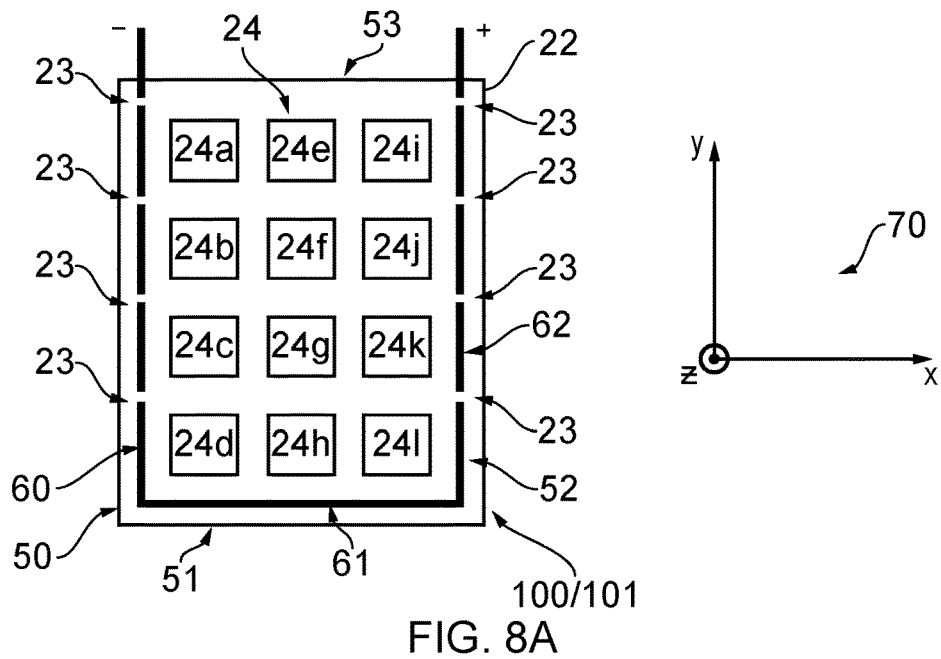
FIG. 8A illustrates a front elevation of a fifth example of the apparatus in which the conductive shape memory material has been threaded through the substrate to couple the conductive shape memory material to the substrate.

FIG. 8A illustrates a front elevation of a fifth example of the apparatus 100/101. The fifth example of the apparatus 100/101 is similar to the fourth example of the apparatus 100/101 in that the first and third elongate portions 60, 62 of conductive material are made from conductive shape memory material 26 and the second elongate portion 61 of conductive material is made from a different conductive material that is not a shape memory material.

In the fifth example of the apparatus 100/101, the first and third elongate portions 60, 62 of conductive material are bound/coupled to the substrate 22 by threading them through the substrate 22 to couple them to the substrate.

The fifth example of the apparatus 100/101 is similar to the fourth example in that the first and third elongate portions 60, 62 of conductive material are bound to the substrate 22 at various binding positions along the length (y) dimension. Each binding position is separated in the length (y) dimension from one or two adjacent binding positions. The first and third elongate portions 60, 62 of conductive material are uncoupled/unbound to the substrate 22 between the binding positions, providing them with freedom to change shape.

As in FIG. 7, it can be seen in FIG. 8A that there are a series of regions between adjacent binding positions that is aligned with pixels in the width (x) dimension. For example, the pixels labeled with the reference numerals 24a, 24e and 24i in FIG. 8A are aligned with a region between two binding positions at which the first elongate portion 60 of conductive material is bound to the substrate 22, and aligned with a region between two binding positions at which the third elongate portion 62 of conductive material is bound to the substrate 22.

Figure 8B:
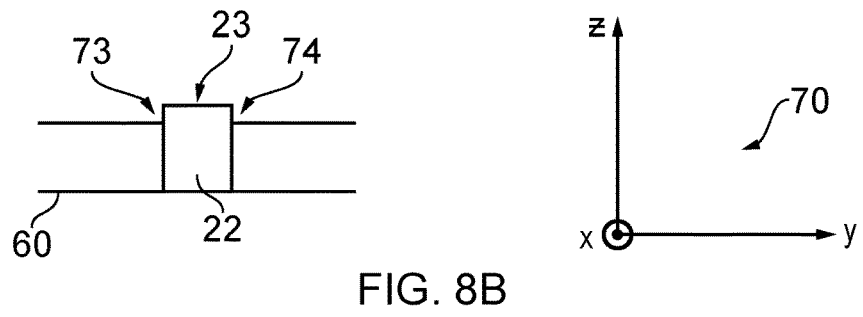
FIG. 8B illustrates a side elevation of the threading of the conductive shape memory material through the substrate.

FIG. 8B illustrates a side elevation of a binding/coupling position where the first elongate portion 60 of conductive material is threaded through the substrate 22. At the various binding positions along the length of the substrate 22, between the first edge 50 and the array of pixels 24, the first elongate portion 60 of conductive material enters a first aperture 73 followed by a second aperture 74, causing a portion 23 of the substrate 22 to be located above the first elongate portion 60 of conductive material at those binding positions. The apertures 73, 74 may, for example, be perforations in the substrate 22.

Figure 9:
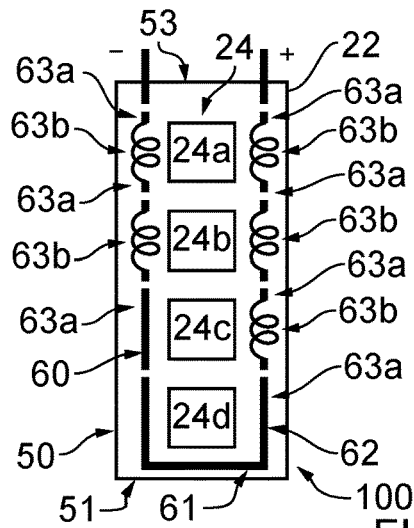
FIG. 9 illustrates a front elevation of a sixth example of the apparatus in which the conductive shape memory material comprises one or more springs.
Figure 9:
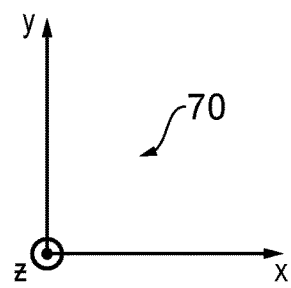

FIG. 9 illustrates a front elevation of a sixth example of the apparatus 100/101. In the illustrated example, the apparatus 100/101 has a one dimensional array of pixels 24, but this need not necessarily be the case. The sixth example of the apparatus 100/101 is similar to the fifth example illustrated in FIGS. 8A and 8B in that the first and third elongate portions 60, 62 of conductive material are coupled/bound to the substrate 22 by threading them through the substrate 22.

The sixth example of the apparatus 100/101 illustrated in FIG. 9 differs from the fifth example illustrated in FIGS. 8A and 8B in that the first and second elongate portions 60, 62 of conductive material include some linear regions 63a and some springs 63b.

In some implementations, both the linear regions 63a and the springs 63b are made from conductive shape memory material 26. In other implementations, the linear regions 63a are made from a different conductive material, which is not a shape memory material, and merely the springs 63b are made from conductive shape memory material 26.

The presence of the springs 63b may enable the first and third elongate portions 60, 62 and the substrate 22 to change shape to a greater extent than is the case in the fifth example illustrated in FIG. 8A. In some implementations, the first elongate portion 60 of conductive material is symmetric with the third elongate portion 62 of conductive material about an axis of symmetry that is aligned with the length (y) dimension. In other implementations, such as that illustrated in FIG. 9, no such symmetry exists. The composition of the first and third elongate portions 60, 62 in relation to the presence of linear regions 63a and springs 63b will depend upon the desired implementation and the desired shape change.

In the example illustrated in FIG. 9, the second elongate portion 61 of conductive material is made from a conductive material that is not a shape memory material, but this need not necessarily be the case.

Figure 10:
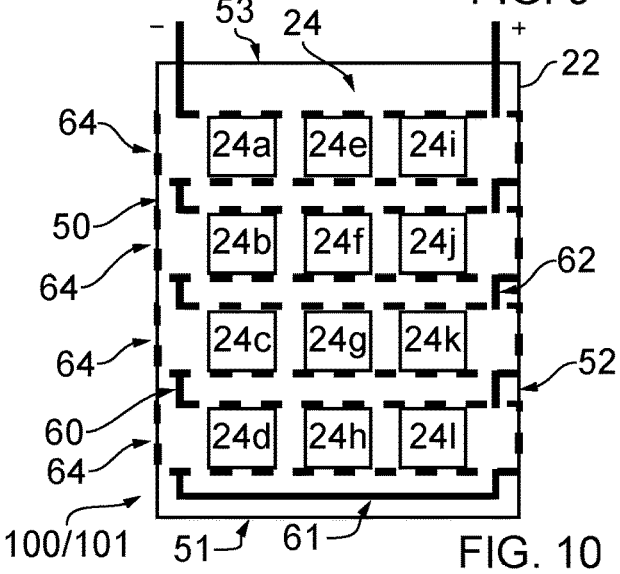
FIG. 10 illustrates a seventh example of the apparatus in which the apparatus comprises one or more stiffeners.
Figure 10:
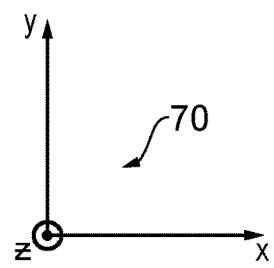

FIG. 10 illustrates a seventh example of the apparatus 100/101. The seventh example of the apparatus 100/101 is similar to the fifth example of the apparatus 100/101 illustrated in FIGS. 8A and 8B, except that it further comprises a plurality of stiffeners 64 which stiffen the apparatus 100/101 in various regions to prevent the substrate 22 from bending/changing shape in regions where the pixels 24a-24l are located. In this regard, the stiffeners 64 may be aligned with the position of the pixels 24a-24l in the width (x) and length (y) dimensions. In the illustrated example, the substrate 22 is positioned between the pixels 24a-24l and the stiffeners 64 but in other implementations, the stiffeners 64 could be positioned between the pixels 24a-24l and the substrate 22.

Figure 11:
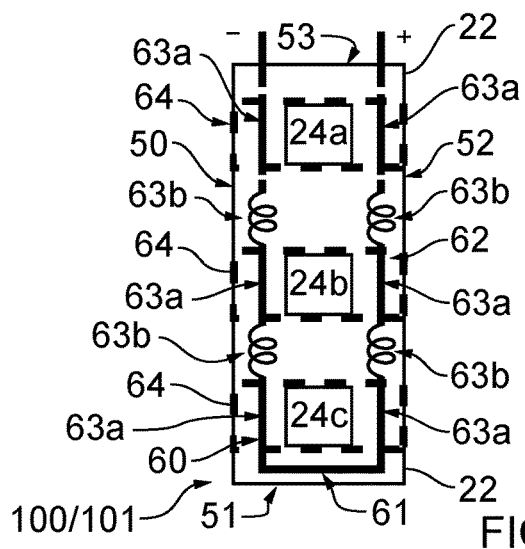
FIG. 11 illustrates an eighth example of the apparatus in which the conductive shape memory material comprises one or more springs and the apparatus comprises one or more stiffeners.
Figure 11:
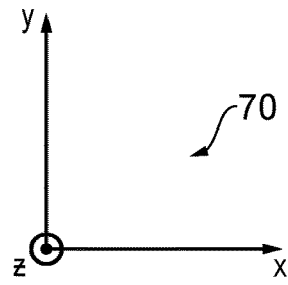

FIG. 11 illustrates an eighth example of the apparatus 100/101 which is effectively a combination of the seventh example of the apparatus 100/101 illustrated in FIG. 9 and the eighth example of the apparatus 100/101 illustrated in FIG. 10. In this regard, the eighth example of the apparatus 100/101 illustrated in FIG. 11 comprises first and third elongate portions 60, 61 of conductive material that each include linear regions 63a and springs 63b and in that it includes a plurality of stiffeners 64 as described above in relation to FIG. 10.

References to 'computer-readable storage medium', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software fora programmable processor or firmware such as, for example, the programmable content of a hardware device whether instructions for a processor, or configuration settings for a fixed-function device, gate array or programmable logic device etc.

As used in this application, the term 'circuitry' refers to all of the following:

(a) hardware-only circuit implementations (such as implementations in only analog and/or digital circuitry) and (b) to combinations of circuits and software (and/or firmware), such as (as applicable):

(i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

The blocks illustrated in FIGS. 2 and 5 may represent steps in a method and/or sections of code in the computer program 16. The illustration of a particular order to the blocks does not necessarily imply that there is a required or preferred order for the blocks and the order and arrangement of the block may be varied. Furthermore, it may be possible for some blocks to be omitted.

Where a structural feature has been described, it may be replaced by means for performing one or more of the functions of the structural feature whether that function or those functions are explicitly or implicitly described.

Although embodiments of the present invention have been described in the preceding paragraphs with reference to various examples, it should be appreciated that modifications to the examples given can be made without departing from the scope of the invention as claimed. For example, it will be appreciated by those skilled in the art that embodiments of the invention are not limited to apparatus 100/101 which bend in the directions discussed above and illustrated in the figures.

In the description above, the first, second and third elongate portions 60-62 of conductive material are described as being part of the same circuit, such that when current is applied by the drive circuitry 20, electrons travel along the first elongate portion 60 of conductive material to the second elongate portion 61 of conductive material, and then subsequently to the third elongate portion 62 of conductive material.

Alternatively, in each of the examples of the apparatus 100/101 described above, any or all of the first, second and third elongate portions 60-62 of conductive material could be connected separately to the drive circuitry 20 (that is, each elongate portion 60-62 is not electrically connected to one or both of the other elongate portions 60-62), such that the drive circuitry 20 can apply current to them separately under the control of the processor 12. This enables one elongate portion 60-62 to undergo a shape change separately from the others, enabling a wider variety of shapes to be formed than if the first, second and third elongate portions 60-62 are electrically connected and controlled collectively.

Also, while the conductive shape memory material 26 is described as being elongate in shape in the examples described above, that need not be the case in every implementation.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the applicant claims protection in respect of any patentable feature or combination of features hereinbefore referred to and/or shown in the drawings whether or not particular emphasis has been placed thereon.

I claim:

1. An apparatus, comprising:
    an array of pixels, configured to detect radiation, provided on a flexible substrate;
    a conductive shape memory material coupled to the flexible substrate;
    drive circuitry configured to apply a current to the conductive shape memory material in order to change a shape of the conductive shape memory material and the flexible substrate; and
    one or more pressure sensors, configured to sense pressure applied by the apparatus to an object when the conductive shape memory material bends.

2. An apparatus according to claim 1, wherein application of a current to the conductive shape memory material causes the conductive shape memory material to bend.

3. An apparatus according to claim 2, wherein the flexible substrate extends in a first dimension and a second dimension, and the conductive shape memory material is arranged to cause the flexible substrate to change shape in the second dimension and not the first dimension when the conductive shape memory material is bent.

4. An apparatus according to claim 3, further comprising: a conductive material, different from the conductive shape memory material, wherein the conductive shape memory material has a first elongate portion that extends in the second dimension and a second elongate portion that extends in the second dimension and is separated from the first elongate portion in the first dimension, and the conductive material, different from the conductive shape memory material, electrically connects the first elongate portion of the conductive shape memory material to the second elongate portion of the conductive shape memory material.

5. An apparatus according to claim 4, wherein the conductive material, different from the conductive shape memory material, is configured to maintain its shape when current is applied to the conductive material.

6. An apparatus according to claim 1, wherein the conductive shape memory material is configured to respond to the application of the current by changing its shape from a first shape to a second shape, and configured to respond to ceasing of the application of the current by changing its shape from the second shape to the first shape.

7. An apparatus according to claim 1, wherein the flexible substrate extends in a first dimension and a second dimension, the conductive shape memory material has an elongate portion that extends in the second dimension and that elongate portion is coupled to the flexible substrate at a first position and a second position, the second position being spaced from the first position in the second dimension.

8. An apparatus according to claim 7, wherein the elongate portion of the conductive shape memory material is uncoupled to the flexible substrate in a region between the first and second positions, and one or more of the pixels are aligned with that region in the first dimension.

9. An apparatus according to claim 8, wherein the uncoupled elongate portion of the conductive shape memory material positioned in the region between the first and second positions comprises a spring.

10. An apparatus according to claim 1, wherein the pixels are configured to directly or indirectly detect X-ray radiation.

11. A method, comprising:
causing a current to be applied to a conductive shape memory material, coupled to a flexible substrate having an array of pixels thereon that are configured to detect radiation, which causes the conductive shape memory material and the flexible substrate to change shape, wherein one or more pressure sensors are configured to sense pressure applied by an apparatus to an object when the conductive shape memory material bends.

12. A method according to claim 11, wherein causing the application of a current to the conductive shape memory material causes the conductive shape memory material to bend.

13. A method according to 12, wherein the flexible substrate extends in a first dimension and a second dimension, and bending of the conductive shape memory material causes bending of the flexible substrate in the second dimension and not the first dimension.

14. A method according to claim 13, further comprising: providing a conductive material, different from the conductive shape memory material, wherein the conductive shape memory material has a first elongate portion that extends in the second dimension and a second elongate portion that extends in the second dimension and is separated from the first elongate portion in the first dimension, and the conductive material, different from the conductive shape memory material, electrically connects the first elongate portion of the conductive shape memory material to the second elongate portion of the conductive shape memory material.

15. A method according to claim 14, wherein providing the conductive material, different from the conductive shape memory material, is configured to maintain its shape when current is applied to the conductive material.

16. A method according to claim 11, wherein the conductive shape memory material is configured to respond to the application of the current by changing its shape from a first shape to a second shape, and configured to respond to ceasing of the application of the current by changing its shape from the second shape to the first shape.

17. A method according to claim 11, wherein the flexible substrate extends in a first dimension and a second dimension, the conductive shape memory material has an elongate portion that extends in the second dimension and that elongate portion is coupled to the flexible substrate at a first position and a second position, the second position being spaced from the first position in the second dimension.

18. A method according to claim 17, wherein the elongate portion of the conductive shape memory material is uncoupled to the flexible substrate in a region between the first and second positions, and one or more of the pixels are aligned with that region in the first dimension.

19. A non-transitory computer readable medium comprising program instructions stored thereon for performing at least the following: causing a current to be applied to a conductive shape memory material, coupled to a flexible substrate having an array of pixels thereon that are configured to detect radiation, which causes the conductive shape memory material and the flexible substrate to change shape, wherein one or more pressure sensors are configured to sense pressure applied by an apparatus to an object when the conductive shape memory material bends.

* * * * *